(12) United States Patent
Deng

(10) Patent No.: US 8,305,798 B2
(45) Date of Patent: Nov. 6, 2012

(54) MEMORY CELL WITH EQUALIZATION WRITE ASSIST IN SOLID-STATE MEMORY

(75) Inventor: Xiaowei Deng, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 156 days.

(21) Appl. No.: 12/834,914

(22) Filed: Jul. 13, 2010

(65) Prior Publication Data
US 2012/0014194 A1    Jan. 19, 2012

(51) Int. Cl.
*G11C 11/00* (2006.01)
*G11C 7/00* (2006.01)

(52) U.S. Cl. .................. 365/156; 365/154; 365/202

(58) Field of Classification Search .......... 365/156
See application file for complete search history.

(56) References Cited

U.S. PATENT DOCUMENTS

| | | | |
|---|---|---|---|
| 7,242,626 B2 * | 7/2007 | Ramaraju et al. | 365/203 |
| 7,376,038 B2 | 5/2008 | Thiruvengadam et al. | |
| 7,385,841 B2 | 6/2008 | Houston | |
| 7,453,743 B2 | 11/2008 | Houston | |
| 7,522,445 B2 * | 4/2009 | Inaba | 365/154 |
| 7,589,991 B2 * | 9/2009 | Masuo | 365/154 |
| 7,596,012 B1 | 9/2009 | Su et al. | |
| 8,030,971 B2 * | 10/2011 | Chiang et al. | 326/121 |
| 2004/0052106 A1 * | 3/2004 | Ohtani | 365/158 |
| 2006/0250838 A1 * | 11/2006 | Ramaraju et al. | 365/154 |
| 2009/0258471 A1 | 10/2009 | Sadra et al. | |
| 2010/0315889 A1 * | 12/2010 | Thomas et al. | 365/189.011 |
| 2012/0069650 A1 * | 3/2012 | Yang et al. | 365/184 |

OTHER PUBLICATIONS

Yamaoka et al., "Low-Power Embedded SRAM Modules with Expanded Margins for Writing", Paper No. 26.4, Tech. Digest of Int'l Solid-State Circuits Conference (IEEE, 2005), pp. 480-481, 611.
Zhang et al., "A 3-GHz 70-Mb SRAM in 65-nm CMOS Technology With Integrated Column-Based Dynamic Power Supply", J. Solid-State Circ., vol. 41, No. 1 (IEEE, Jan. 2006), pp. 146-151.
Deng, Xiaowei, "Bit-By-Bit Write Assist for Solid-State Memory", U.S. Appl. No. 12/822,706, filed Jun. 24, 2010.

* cited by examiner

*Primary Examiner* — Son Mai
(74) *Attorney, Agent, or Firm* — Rose Alyssa Keagy; Wade J. Brady, III; Frederick J. Telecky, Jr.

(57) ABSTRACT

A solid-state memory in which write assist circuitry is implemented within each memory cell. Each memory cell includes a storage element, such as a pair of cross-coupled inverters, and an equalization gate connected between the storage nodes of the storage element. The equalization gate may be realized by two transistors in series, or as a double-gate transistor. The equalization gate is controlled by a word line indicating selection of the row containing the cell in combination with a column select signal indicating selection of the column containing the cell in a write cycle. Upon a write to a selected cell, both gates are turned on, connecting the storage nodes of the cell to one another and assisting the write of the opposite date state from that previously stored.

26 Claims, 9 Drawing Sheets

MEMORY CELL WITH EQUALIZATION WRITE ASSIST IN SOLID-STATE MEMORY

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of solid-state memory. Embodiments of this invention are more specifically directed to static random access memory (SRAM) cells and devices.

Many modern electronic devices and systems now include substantial computational capability for controlling and managing a wide range of functions and useful applications. The computational power of these modern devices and systems is typically provided by one or more processor "cores". These processor cores operate as a digital computer, in general retrieving executable instructions from memory, performing arithmetic and logical operations on digital data retrieved from memory, and storing the results of those operations in memory. Other input and output functions for acquiring and outputting the data processed by the processor cores are performed as appropriate. Considering the large amount of digital data often involved in performing the complex functions of these modern devices, significant solid-state memory capacity is now commonly implemented in the electronic circuitry for these systems.

Static random access memory (SRAM) has become the memory technology of choice for much of the solid-state data storage requirements in these modern power-conscious electronic systems. As is fundamental in the art, SRAM cells store contents "statically", in that the stored data state remains latched in each cell so long as power is applied to the memory; this is in contrast to "dynamic" RAM ("DRAM"), in which the data must be periodically refreshed in order to be retained.

Advances in semiconductor technology in recent years have enabled the shrinking of minimum device feature sizes (e.g., MOS transistor gates) into the sub-micron range. This miniaturization is especially beneficial when applied to memory arrays, because of the large proportion of the overall chip area often devoted to on-chip memories. As a result, significant memory resources are now often integrated as embedded memory into larger-scale integrated circuits, such as microprocessors, digital signal processors, and "system-on-a-chip" integrated circuits. However, this physical scaling of device sizes raises significant issues, especially in connection with embedded SRAM but also in SRAM realized as "stand-alone" memory integrated circuit devices. Several of these issues are due to increased variability in the electrical characteristics of transistors formed at these extremely small feature sizes. This variability in characteristics has been observed to increase the likelihood of read and write functional failures, on a cell-to-cell basis. Sensitivity to device variability is especially high in those memories that are at or near their circuit design limits. The combination of increased device variability with the larger number of memory cells (and thus transistors) within an integrated circuit renders a high likelihood that one or more cells cannot be read or written as expected.

An example of a conventional SRAM cell is shown in FIG. 1a. In this example, SRAM cell 12 is a conventional six-transistor (6-T) static memory cell 12, which in this case is in the $j^{th}$ row and $k^{th}$ column of a memory array. SRAM memory cell 12 is biased between the voltage on power supply line $V_{dda}$ and a ground reference voltage $V_{ssa}$. SRAM memory cell 12 is constructed in the conventional manner as a pair of cross-coupled CMOS inverters, one inverter of series-connected p-channel load transistor 13a and n-channel driver transistor 14a, and the other inverter of series-connected p-channel load transistor 13b and n-channel transistor 14b; the gates of the transistors in each inverter are connected together and to the common drain node of the transistors in the other inverter, in the usual manner. The common drain node of transistors 13a, 14a constitutes storage node SNT, and the common drain node of transistors 13b, 14b constitutes storage node SNB, in this example. N-channel pass transistor 15a has its source/drain path connected between storage node SNT and bit line $BLT_k$ for the $k^{th}$ column, and n-channel pass transistor 15b has its source/drain path connected between storage node SNB and bit line $BLB_k$. The gates of pass transistors 15a, 15b are driven by word line $WL_j$ for this $j^{th}$ row in which cell 12 resides.

In operation, bit lines $BLT_k$, $BLB_k$ are typically precharged to a high voltage (at or near power supply voltage $V_{dda}$), and are equalized to the same voltage. To access cell 12 for a read operation, word line $WL_j$ is then energized, turning on pass transistors 15a, 15b, and connecting storage nodes SNT, SNB to bit lines $BLT_k$, $BLB_k$. The differential voltage developed on bit lines $BLT_k$, $BLB_k$ is then sensed and amplified by a sense amplifier. In a write operation, typical modern SRAM memories include write circuitry that pulls one of bit lines $BLT_k$, $BLB_k$ low (i.e., to a voltage at or near ground voltage $V_{ssa}$), depending on the data state to be written. Upon word line $WL_j$ then being energized, the low level bit line $BLT_k$ or $BLB_k$ will pull down its associated storage node SNT, SNB, causing the cross-coupled inverters of addressed cell 12 to latch in the desired state.

As mentioned above, device variability can cause read and write failures, particularly in memory cells constructed with sub-micron minimum feature size transistors. A write failure occurs when an addressed SRAM cell does not change its stored state when written with the opposite data state. Typically, this failure has been observed to be due to the inability of write circuitry to pull down the storage node currently latched to a high voltage. FIG. 1b illustrates such a write failure for the case of an instance of cell 12 of FIG. 1a. In the example of FIG. 1b, SRAM cell 12 begins in the state in which storage node SNT is at a "1" and storage node SNB is at a "0". FIG. 1b illustrates the writing of a "0" state to storage node SNT. This write is attempted by bit line $BLT_k$ being pulled low (not shown in FIG. 1b), and connected to storage node SNT by pass transistor 15a, while the precharged ($V_{dda}$) voltage is applied to storage node SNB via pass transistor 15b. The write of cell 12 thus depends on the ability of pass transistor 15a to overcome the drive of transistors 13a and 14b.

FIG. 1b illustrates the behavior of storage nodes SNT, SNB in failed cell 12 upon word line $WL_j$ being activated. In this case, device imbalances within cell 12 prevent the "flipping" of its state. This is evident by the low voltage at bit line $BLT_k$ being unable to pull storage node SNT to a logic low level low, upon word line $WL_j$ being activated; conversely, the precharged high voltage at bit line $BLB_k$ is unable to adequately charge storage node SNB. As evident from FIG. 1b, the voltages to which storage nodes SNT, SNB are driven by this write operation do not reach the trip levels of the inverters in cell 12. Upon word line $WL_j$ returning inactive low (which turns off pass transistor 15a, 15b and disconnects storage nodes SNT, SNB from bit lines $BLT_k$, $BLB_k$), storage node SNT latches back to a high level despite the attempted write. The write of cell 12 to a "0" state at storage node SNT has failed.

Write failures are the converse of cell stability failures—a write failure occurs if a cell is too stubborn in changing its state, while a cell stability failure occurs if a cell changes its state too easily, such as during a write to a cell in the same column. In conventional SRAM cells such as 6-T SRAM cell 12 of FIG. 1a, the designer is faced with a tradeoff between cell stability on one hand, and write margin on the other. In a general sense, cell stability is favored by pass transistors 15a, 15b having relatively weak drive as compared with load transistors 13 and driver transistors 14, because this results in weak coupling between the bit lines and storage nodes, and relatively strong drive of the latched state at storage nodes SNT, SNB. Conversely, write margin is favored by pass transistors 15a, 15b having relatively strong drive as compared with load transistors 13 and driver transistors 14, because this enables strong coupling between the bit lines and storage nodes, resulting in storage nodes SNT, SNB having weak resistance to changing state. Accordingly, the design of conventional 6-T SRAM cells 12 involves a tradeoff between these two vulnerabilities.

Unfortunately, the design window in which both adequate cell stability and adequate write margin can be attained is becoming smaller with continued scaling-down of device feature sizes, for the reasons mentioned above. In addition, it has been observed that the relative drive capability of p-channel MOS transistors relative to n-channel MOS transistors is increasing as device feature sizes continue to shrink, which skews the design window toward cell stability over write margin.

One conventional approach toward relaxing these ever-tightening design constraints is known in the art as "write-assist". According to this approach, the power supply bias applied to SRAM cells (e.g., power supply voltage $V_{dda}$ of FIG. 1) in write cycles is reduced, or disconnected so as to float. Conventional write-assist circuitry includes a power switch associated with each column of an array, or in some cases associated with multiple columns. Floating write assist bias in write cycles is attained by the power switch disconnecting cells in the selected column from the power supply voltage. In one approach, reduced voltage write assist bias turns off, in write cycles, a power switch that is connected in parallel with a diode-connected transistor between the memory cells and the power supply voltage. The cell bias in the selected column is thus at least a diode voltage drop from the full power supply voltage, during write cycles. For either reduced or floating write assist bias, the drive of the load and driver transistors in the SRAM cell is reduced relative to the drive of the pass transistors, making it easier for the low level bit line to flip the state of the addressed cell.

As mentioned above, conventional write-assist circuitry is generally implemented on a per-column basis, in that the reduced or floating write bias is applied to one or more columns of memory cells, even though only one cell in a given column is selected for connection to the bit lines. Those cells that are "half-selected" in a write operation (i.e., are in a selected column receiving the reduced or floating write assist bias, but are not in the selected row) are vulnerable to undesired changes of state, because of the reduced cell bias. Given the large number of memory cells in a typical SRAM array, one or more retention "tail bits" with substantially weaker stability margin are often present within the array, especially in cutting-edge memories constructed with minimum feature size geometries, as mentioned above. These marginal retention tail bits require a higher cell bias in order to retain a data state during a write to a cell in the same column. As such, to avoid data retention failure, the write assist voltage must be kept above the retention voltage of the weakest, or most unstable, bits in the SRAM array. This reduces the ability of write assist techniques to widen the ever-shrinking design window.

By way of further background, my copending and commonly assigned U.S. patent application Ser. No. 12/827,706, filed Jun. 24, 2010, entitled "Bit-by-Bit Write Assist for Solid-State Memory", describes a solid-state memory in which write assist circuitry is implemented within each memory cell. As described in this application, each memory cell includes a pair of power switch transistors that selectably apply bias (either power supply voltage $V_{dd}$ or ground) to the inverters of the memory cell. One of the power switch transistors is gated by a word line indicating selection of the row containing the cell, and the other is gated by a column select signal indicating selection of the column containing the cell in a write cycle. Upon a write to the cell, both power switch transistors are turned off, removing bias from the inverter. With bias removed from the inverters, the writing of an opposite cell state is facilitated.

BRIEF SUMMARY OF THE INVENTION

Embodiments of this invention provide a memory cell, and method of operating the same, in which strong write assist is applied without impacting the stability of half-selected cells.

Embodiments of this invention provide such an array and method in which design constraints on the memory cells can be skewed to favor cell stability.

Embodiments of this invention provide such an array and method in which write operations can be carried out faster than in conventional memories.

Embodiments of this invention provide such an array and method that are compatible with modern sub-micron transistor sizes in which the drive of p-channel load transistors in the memory cells approaches that of n-channel driver transistors.

Other objects and advantages of this invention will be apparent to those of ordinary skill in the art having reference to the following specification together with its drawings.

The present invention may be implemented into a memory cell, such as a static random access memory (SRAM) cell, by way of one or more equalization transistors included within the cell, and connected between first and second storage nodes. The equalization transistors are controlled by a row select signal, which may be the word line for the row containing the cell, and a column select line for the column containing the cell. In write cycles, the equalization transistors are turned on in cells that are in the selected row and also in the selected column, shorting the storage nodes to one another and thus assisting a change of state. In one embodiment, two equalization transistors are connected in series with one another between the two storage nodes, with one switch transistor controlled by the word line and the other controlled by the column select signal. In another embodiment, a single double-gate equalization transistor is used.

BRIEF DESCRIPTION OF THE SEVERAL VIEWS OF THE DRAWING

FIG. 1b is a timing diagram illustrating a write failure in the conventional memory cell of FIG. 1a.

DETAILED DESCRIPTION OF THE INVENTION

The present invention will be described in connection with its embodiments, namely as implemented into a static random access memory (SRAM) embedded within a larger scale integrated circuit, and constructed according to complementary metal-oxide-semiconductor (CMOS) technology, because it is contemplated that this invention is especially beneficial in such an application. However, it is contemplated that those skilled in the art having reference to this specification will readily recognize that this invention may be applied to a wide range of memory devices, including other types of static memory such as ferroelectric random access memories (FRAMs, or FeRAMs), dynamic random access memories (DRAMs), and the like. Accordingly, it is to be understood that the following description is provided by way of example only, and is not intended to limit the true scope of this invention as claimed.

Figure 1A:
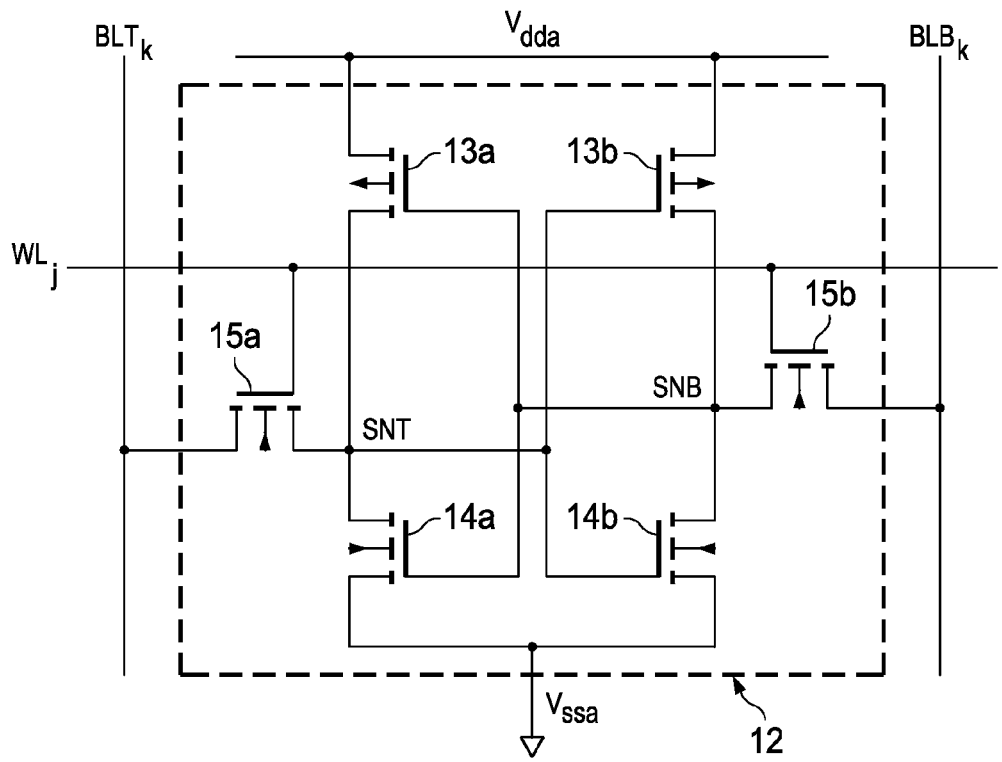
FIG. 1a is an electrical diagram, in schematic form, of a conventional 6-transistor static random access memory (SRAM) cell.
Figure 1B:
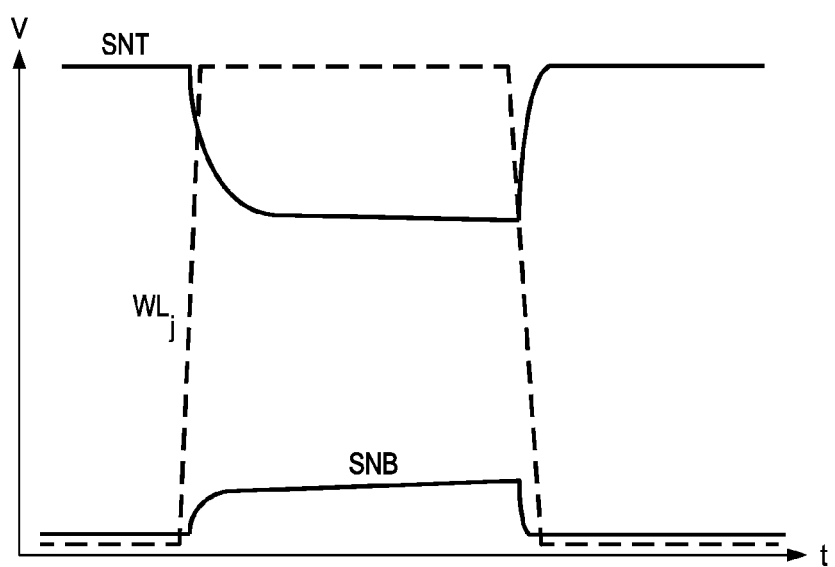
Figure 2:
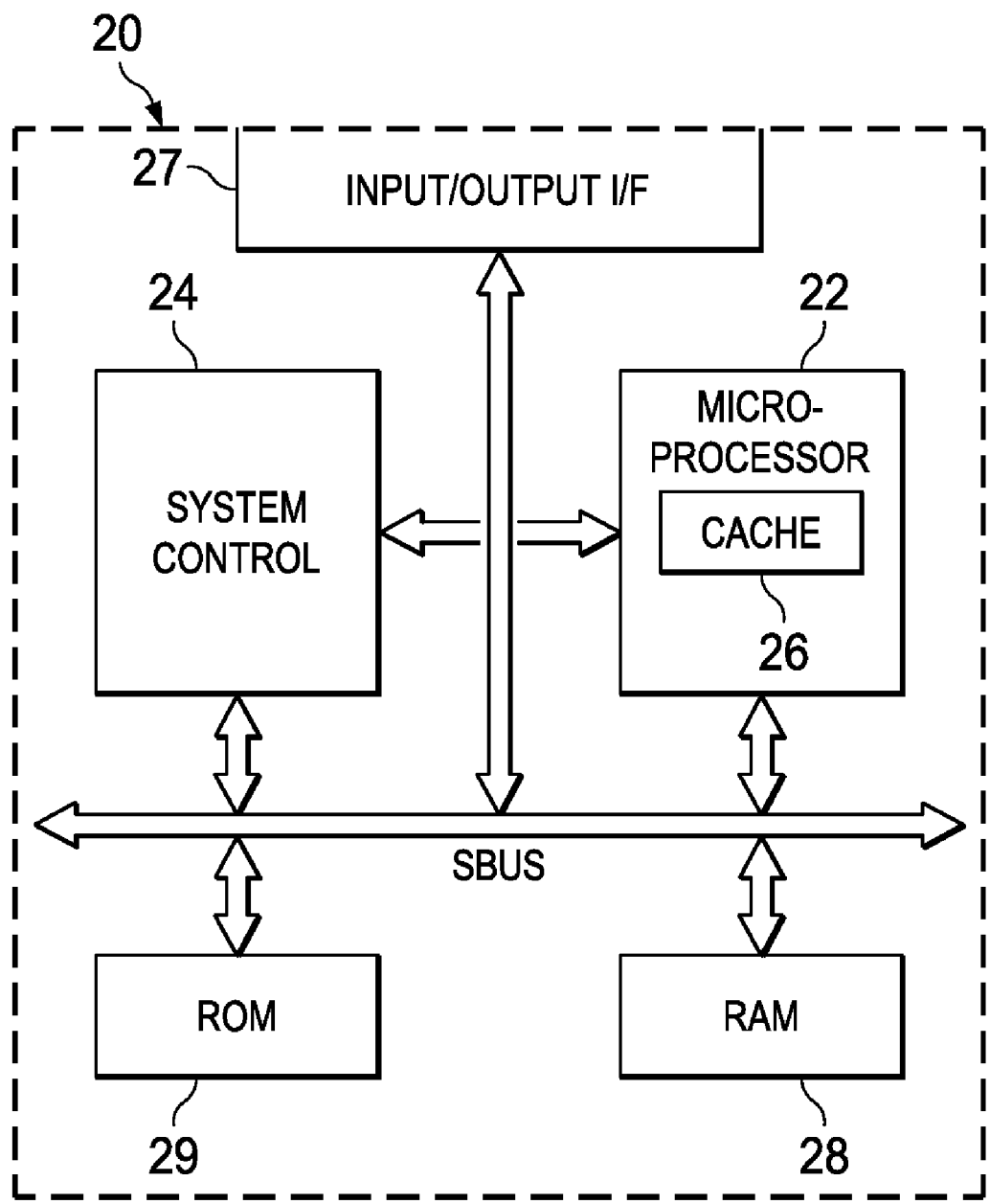
FIG. 2 is an electrical diagram, in block form, of a large scale integrated circuit constructed according to embodiments of the invention.

FIG. 2 illustrates an example of large-scale integrated circuit 20, in the form of a so-called "system-on-a-chip" ("SoC"), as now popular in many electronic systems. Integrated circuit 20 is a single-chip integrated circuit into which an entire computer architecture is realized. As such, in this example, integrated circuit 20 includes a central processing unit of microprocessor 22, which is connected to system bus SBUS. Various memory resources, including random access memory (RAM) 28 and read-only memory (ROM) 29, reside on system bus SBUS and are thus accessible to microprocessor 22. Typically, ROM 29 serves as program memory, storing the program instructions executable by microprocessor 22, while RAM 28 serves as data memory; in some cases, program instructions may reside in RAM 28 for recall and execution by microprocessor 22. Cache memory 26 (such as level 1, level 2, and level 3 caches, each typically implemented as SRAM) provides another memory resource, and resides within microprocessor 22 itself and therefore does not require bus access. Other system functions are shown, in a generic sense, in integrated circuit 20 by way of system control 24 and input/output interface 27.

Those skilled in the art having reference to this specification will recognize that integrated circuit 20 may include additional or alternative functions to those shown in FIG. 2, or may have its functions arranged according to a different architecture from that shown in FIG. 2. The architecture and functionality of integrated circuit 20 is thus provided only by way of example, and is not intended to limit the scope of this invention.

Figure 3:
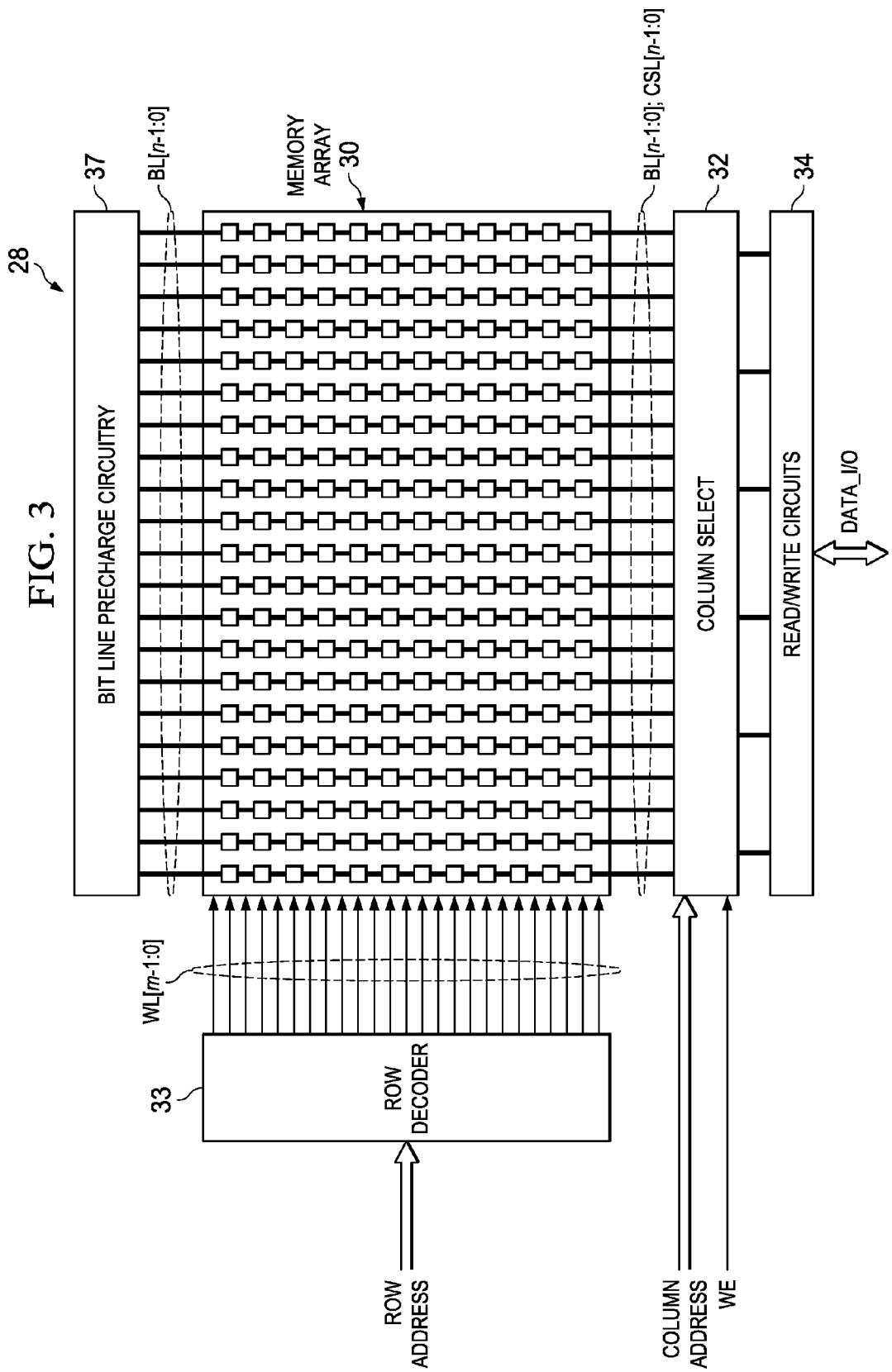
FIG. 3 is an electrical diagram, in block form, of a memory in the integrated circuit of FIG. 2, constructed according to embodiments of the invention.

The construction of RAM 28 in integrated circuit 20 will now be described in further detail, with reference to FIG. 3. Of course, a similar construction may be used to realize other memory resources such as cache memory 26; further in the alternative, RAM 28 may correspond to a stand-alone memory integrated circuit (i.e., not an embedded memory as shown in FIG. 2). Those skilled in the art having reference to this specification will comprehend that the memory architecture of RAM 28 in FIG. 3 is provided by way of example only.

In this example, RAM 28 includes many memory cells arranged in rows and columns within memory array 30. The construction of these memory cells according to embodiments of this invention will be described in further detail below. In this example, memory array 30 includes m rows and n columns of SRAM cells, with cells in the same column sharing a pair of bit lines BL[n−1:0], and with memory cells in the same row sharing one of word lines WL[m−1:0]. Bit line precharge circuitry 37 is provided to apply a desired precharge voltage to the pairs of bit lines BL[n−1:0] in advance of read and write operations. Row decoder 33 receives a row address value indicating the row of memory array block 30 to be accessed, and energizes the one of word lines WL[m−1:0] corresponding to that row address value. Column select circuit 32 receives a column address value, and in response selects pairs of bit lines BL[n−1:0] associated with one or more columns to be placed in communication with read/write circuits 34. In embodiments of this invention, column select circuit 32 generates signals on column select lines CSL[n−1:0] according to the column address value and also responsive to write enable signal WE indicating a write operation (e.g., by way of a logical AND gate of the decoded column address lines with the write enable signal); column select circuit 32 forwards these column select lines CSL[n−1:0] to the memory cells in each of the n columns of memory array 30. Read/write circuits 34, which may be realized as conventional sense amplifiers and write circuits as known in the art for SRAM devices, are in communication with bus DATA I/O, by way of which output data and input data are communicated from and to the addressed memory cells within memory array 30, in the conventional manner.

Of course, many variations in the particular memory arrangement can be realized within this architecture, and by way of variations to this architecture, in connection with this embodiment of the invention. For example, read/write circuits may be placed between bit lines BL[n−1:0] and column select circuits, such that each bit line pair is connected to a read/write circuit, with the column select circuits selecting which read/write circuits are to be placed in communication with data bus DATA I/O.

The construction of memory cells arranged in memory array 30, according to embodiments of this invention, will now be described. This construction will be described using, by way of example, SRAM cells formed of cross-coupled CMOS inverters, because it is contemplated that this invention is especially beneficial when used in connection with such memory cells. However, it is also contemplated that embodiments of this invention will provide important benefits in memories of other types, such as SRAM cells with resistor loads, 8-T or 10-T SRAM cells (e.g., SRAM cells including separate read and write bit lines), ferroelectric static RAM (FeRAM) cells based on cross-coupled inverters, and the like. It is contemplated that those skilled in the art having reference to this specification will be readily able to apply embodiments of this invention to advantage in connection with such other memory cell types and technologies.

Figure 4:
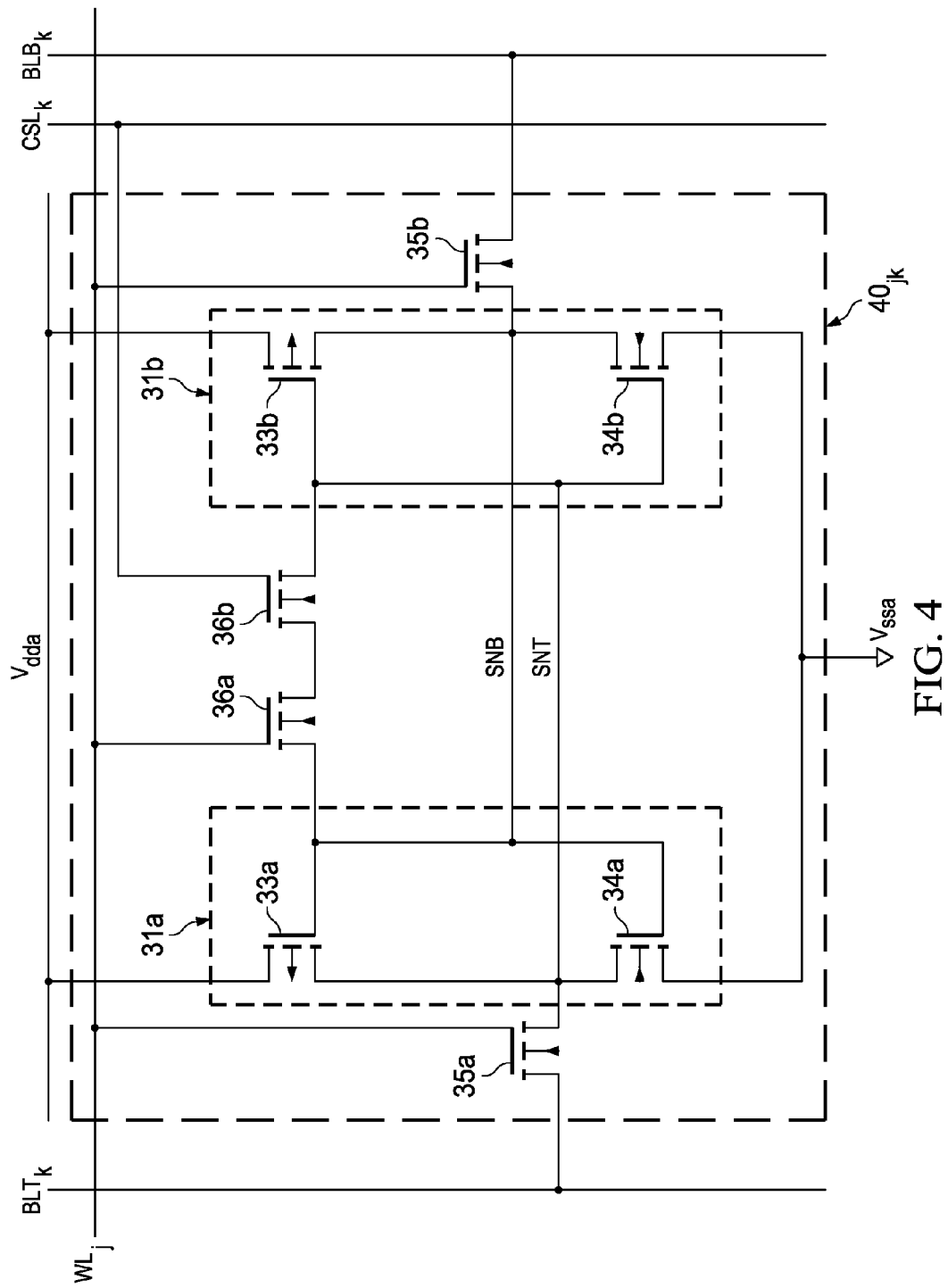
FIG. 4 is an electrical diagram, in schematic form, of a memory cell in the memory of FIG. 3 according to an embodiment of the invention.

FIG. 4 illustrates the construction of SRAM cell $40_{jk}$ according to a first embodiment of the invention. In this construction, SRAM cell $40_{jk}$ includes a storage element formed by a pair of cross-coupled CMOS inverters 31a, 31b. As shown in FIG. 4, inverter 31a is formed by p-channel MOS load transistor 33a and n-channel MOS driver transistor 34a, which have their drains connected together at storage node SNT and their gates connected together at storage node SNB. The source of load transistor 33a is connected to power supply node $V_{dda}$, and the source of driver transistor 34a is connected to ground, or reference, node $V_{ssa}$. Inverter 31b in SRAM cell $40_{jk}$ is similarly constructed as p-channel MOS load transistor 33b and n-channel MOS driver transistor 34b. The drains of transistors 33b, 34b are connected together at storage node SNB, and their gates are connected together at storage node SNT, thus cross-coupling storage nodes SNT, SNB. The source of transistor 33b is at power supply node $V_{dda}$ and the source of transistor 34b is at ground node $V_{ssa}$. Storage nodes SNT and SNB are thus complementary storage nodes in SRAM cell $40_{jk}$, in that when SRAM cell $40_{jk}$ is not accessed, their logic states are complementary to each other (one at a logic "0" and the other at a logic "1").

When deployed in a memory architecture such as that described above relative to FIG. 3, SRAM cell $40_{jk}$ corresponds to the memory cell in row j and column k of that memory array 30. As such, SRAM cell $40_{jk}$ includes n-channel MOS pass transistor 35a with its source/drain path connected between storage node SNT and bit line $BLT_k$ (for column k in memory array 30); similarly, n-channel MOS pass transistor 35b has its source/drain path connected between storage node SNB and bit line $BLB_k$. The gates of pass transistors 35a, 35b are connected to word line $WL_j$, which is driven by row decoder 33 responsive to the received row address indicating selection of row j. In the architecture of FIG. 3, for example, bit lines $BLT_k$, $BLB_k$ are coupled to bit line precharge circuitry 37, on one end, and to column select circuitry 32, on the other. Each of memory cells 40 in column k of memory array 30 are, of course, also coupled to bit lines $BLT_k$, $BLB_k$. Similarly, each of memory cells 40 in row j of memory array 30 are coupled to word line $WL_j$.

According to this embodiment of the invention, an equalization gate, consisting of a pair of equalization transistors 36a, 36b, is also included within memory cell $40_{jk}$. Equalization transistors 36a, 36b are each n-channel MOS transistors in this example, with their source/drain paths connected in series with one another between storage node SNT and storage node SNB. Transistor 36a receives word line $WL_j$ at its gate, and transistor 36b receives column select line $CSL_k$ for column k at its gate. The position of equalization transistors 36a, 36b relative to one another in their series connection between storage nodes SNT, SNB can be reversed from that shown in FIG. 4, if desired. According to this embodiment of the invention, when both word line $WL_j$ and column select line $CSL_k$ are asserted active high, n-channel transistors 36a, 36b, respectively, are turned on. With both transistors 36a, 36b turned on, storage node SNT is shorted to storage node SNB.

Referring back to FIG. 3, column select circuitry 32 asserts column select line $CSL_k$ to an active (high) level in response to receiving a column address value corresponding to the selection of column k, in a write cycle as indicated by write enable line WE. As described above, word line $WL_j$ is asserted to an active (high) level upon row j being selected by row decoder 33 in response to the received row address. As such, storage nodes SNT, SNB are shorted to one another, to equalize their voltages, in each write cycle to those memory cells $40_{jk}$ in the selected row j and the selected column or columns k.

It is useful from a layout and chip area standpoint to use word line $WL_j$ itself as the signal controlling the gate of equalization transistor 36a, because word line $WL_j$ is necessarily routed to each memory cell 40 in row j for control of pass transistors 35a, 35b, in both read and write cycles; in addition, it is useful to gate column select lines $CSL_k$ with the write enable signal, considering that a column select signal is not required in performing a read operation in cells such as cell $40_{jk}$ that are based on the 6-T construction. However, equalization transistors 36a, 36b may be controlled by other signals based on the received memory address, within the scope of this invention. In any case, however, the equalization of storage nodes SNT, SNB in a given memory cell $40_{jk}$ should be based on the selection of row j and column k in which memory cell $40_{jk}$ resides, and gated to occur in write cycles but not read cycles. For example, equalization transistor 36a may be controlled by a row select signal other than word line $WL_j$ itself. Further in the alternative, the row select signal controlling equalization transistor 36a may be based on both the row address and the write enable signal, in which case column select line $CSL_k$ applied to the gate of equalization transistor 36b need not depend on the write enable signal (i.e., and thus may be asserted in both write and read cycles). It is contemplated that other variations to the particular embodiments of the invention described in this specification will be apparent to those skilled in the art having reference to this specification.

Figure 5:
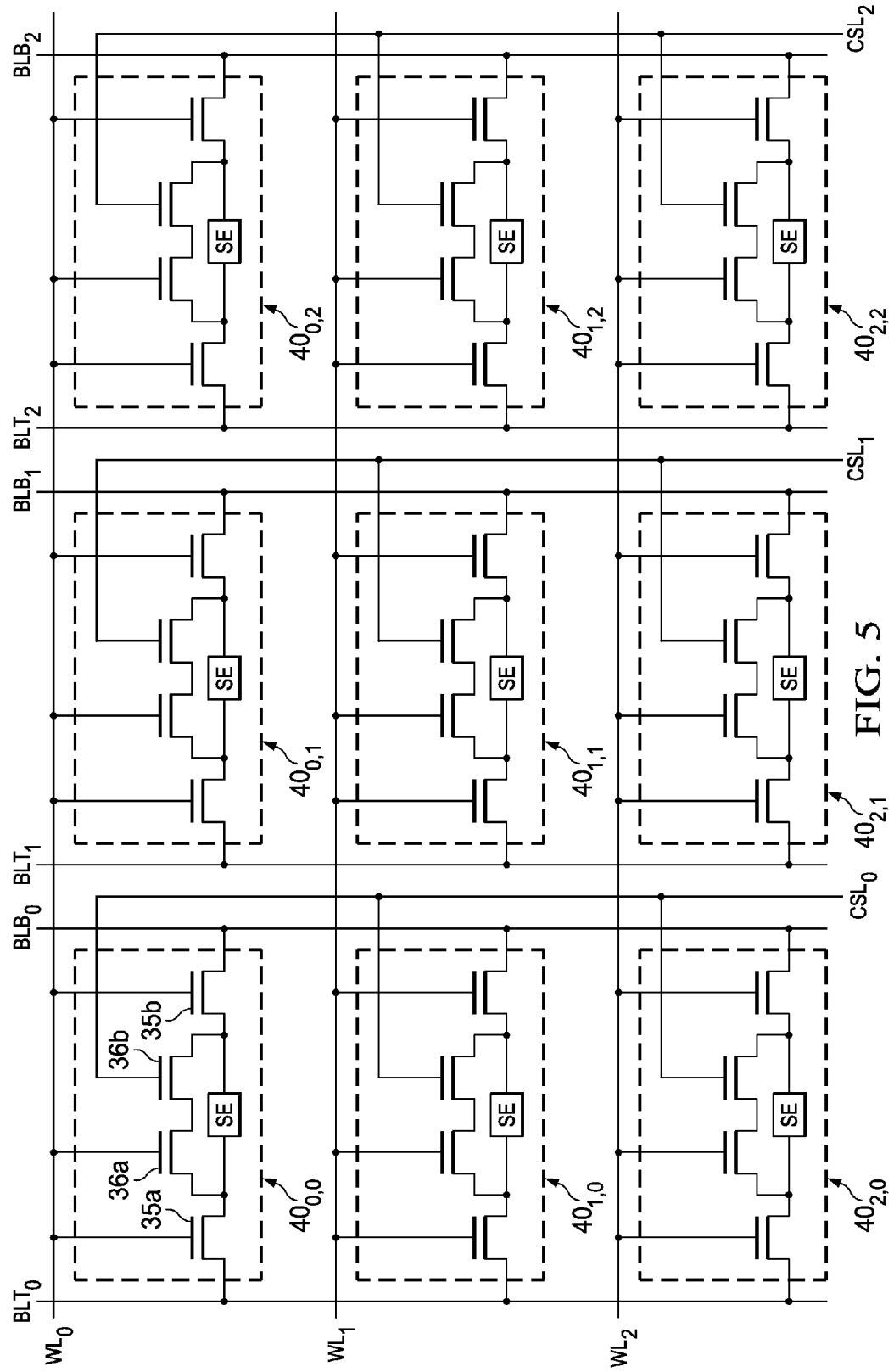
FIG. 5 is an electrical diagram, in schematic form, of a memory array including the memory cell of FIG. 4 according to an embodiment of the invention.

The arrangement of multiple memory cells 40 into memory array 30 is illustrated in FIG. 5, with reference to a 3×3 portion of memory array 30. The portion of memory array 30 shown in FIG. 5 includes portions of rows j=0 through 2, and portions of columns k=0 through 2. Memory cells $40_{0,x}$ (i.e., cells $40_{0,0}$, $40_{0,1}$, $40_{0,2}$) receive word line $WL_0$, memory cells $40_{1,x}$ receive word line $WL_1$, and memory cells $40_{2,x}$ receive word line $WL_2$. Similarly, memory cells $40_{x,0}$ (i.e., cells $40_{0,0}$, $40_{1,0}$, $40_{2,0}$) receive column select line $CSL_0$, memory cells $40_{x,1}$ receive column select line $CSL_1$, and memory cells $40_{x,2}$ receive column select line $CSL_2$. According to this embodiment of the invention described above in connection with FIG. 4, each of cells 40 in memory array 30 includes storage element SE (e.g., cross-coupled inverters 31a, 31b), pass transistors 35a, 35b and equalization transistors 36a, 36b, as shown by the example of memory cell $40_{0,0}$. As described above, equalization transistors 36a, 36b selectively connect storage nodes SNT, SNB to one another in each of cells 40 in memory array 30.

Referring back to FIG. 4, the operation of memory cell $40_{jk}$ according to this embodiment of the invention depends on whether memory cell $40_{jk}$ is selected by the address values applied to row decoder 33 and column select circuitry 32. In cycles in which row j is not selected (word line $WL_j$ is inactive at a low logic level), pass transistors 35a, 35b are held off, and equalization transistor 36a is also turned off. Storage nodes SNT, SNB are thus isolated from one another regardless of the state of transistor 36b, and thus the stored state of cell $40_{jk}$ is actively maintained at storage nodes SNT, SNB. In write cycles in which column k is not selected, and in read cycles regardless of whether column k is selected, column select line $CSL_k$ is inactive at a low logic level, equalization transistor 36b is turned off, and storage nodes SNT, SNB are isolated from one another even in selected row j (i.e., even if word line $WL_j$ is active high). As such, according to this construction, if memory cell $40_{jk}$ is in a half-selected state (column k is selected but row j is not selected, or row j is selected but column k is not selected), or if memory cell $40_{jk}$ is a selected cell in a read cycle, one of equalization transistors 36a, 36b is turned off and storage nodes SNT, SNB remain isolated from one another. As a result of this embodiment of the invention, the data retention of memory cell $40_{jk}$ is not affected in write cycles even if half-selected, in contrast to memories including conventional column-based write assist circuits.

Figure 6:
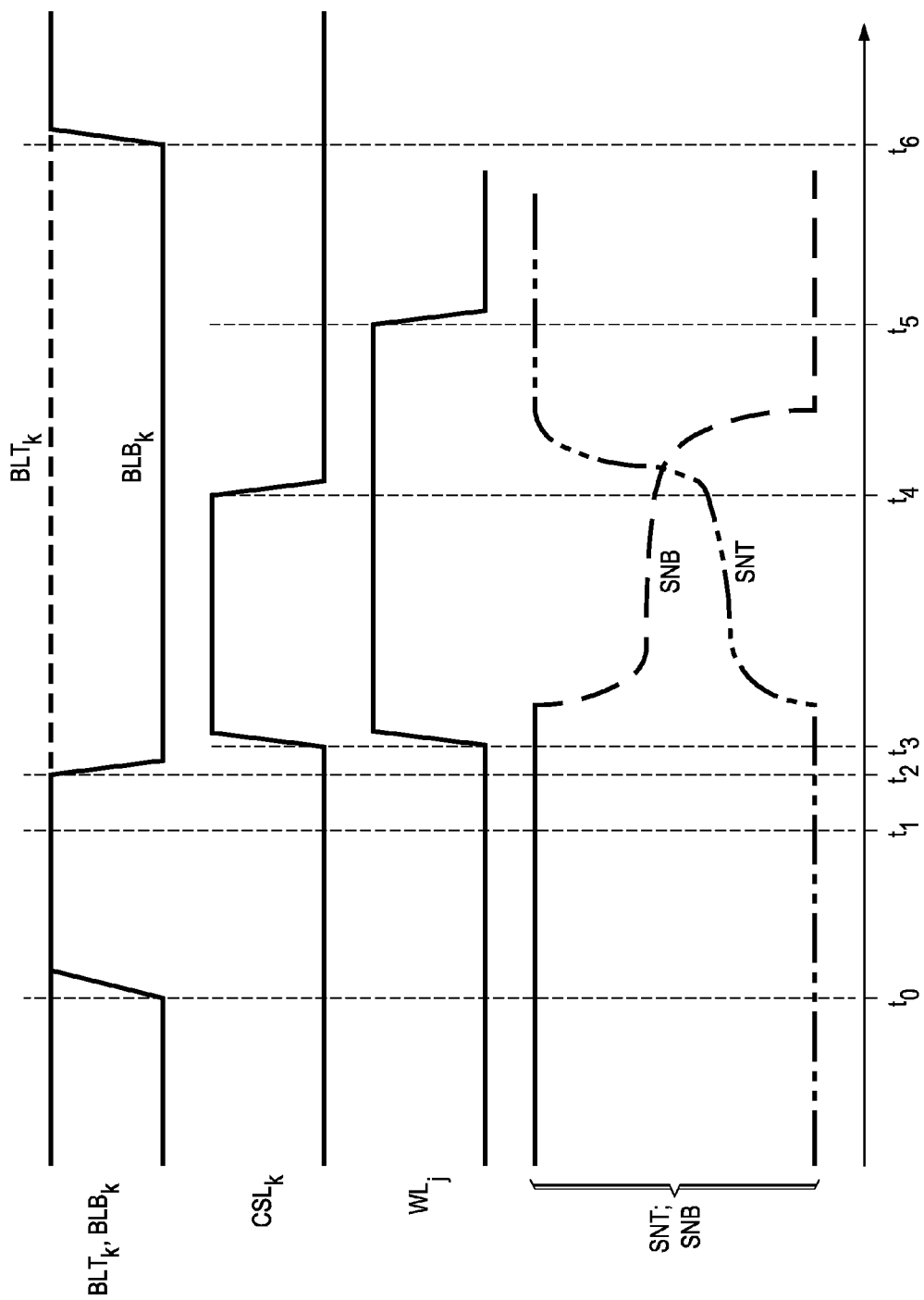
FIG. 6 is a timing diagram illustrating the operation of the memory cell of FIG. 4 according to an embodiment of the invention.

In a write operation to memory cell $40_{jk}$, both of word line $WL_j$ and column select line $CSL_k$ will be energized. FIG. 6 illustrates the timing of such a write cycle to selected memory cell $40_{jk}$, according to this embodiment of the invention, with reference also to FIGS. 3 and 4. Prior to the beginning of the write cycle at time $t_0$, all word lines including word line $WL_j$ are inactive (at a low logic level, in this example); in addition, all column select lines including column select line $CSL_k$ are also inactive low. In the example shown in FIG. 6, storage node SNB is at a high "1" level prior to time $t_0$, and storage node SNT is at a low "0" level, as established by load transistor 33b and driver transistor 34a both being turned on. One of bit lines $BLT_k$, $BLB_k$ is at a low level prior to time $t_0$ in this example, from the previous cycle. Prior to time $t_0$, both of equalization transistors 36a, 36b are turned off, and storage nodes SNT, SNB are isolated from one another.

The write cycle begins, at time $t_0$, with bit line precharge circuitry 37 precharging bit lines $BLT_k$, $BLB_k$ (as well as all bit line pairs in memory array 30) to a high voltage, for example to power supply voltage $V_{dda}$. At time $t_1$, precharge circuitry 37 turns off; the precharged high voltage remains at then-floating bit lines $BLT_k$, $BLB_k$. The write operation begins at time $t_2$, with the write circuit for column k (within read/write circuits 34) driving bit line $BLB_k$ to a low level in this example, to change the state of cell $40_{jk}$ from its current "0" state to a "1" state (i.e., storage node SNT will be written to a "1" level). At time $t_3$, column select line $CSL_k$ is driven active high by column select circuitry 32 in response to the column address corresponding to column k and to write enable line WE (FIG. 3) indicating a write cycle. Also at time $t_3$, word line $WL_j$ is driven high in response to row decoder 33 receiving a row address corresponding to row j.

The particular timing of column select line $CSL_k$ and word line $WL_j$ relative to one another can vary, as suggested by FIG. 6. The transition at word line $WL_j$ can lead or lag the transition at column select line $CSL_k$, or the two can be nominally simultaneous. The particular timing of these signals can be selected as convenient for the design and operation of RAM 28. Furthermore, in the alternative to the example of FIG. 6, the transitions at column select line $CSL_k$ and word line $WL_j$ can lead or be nominally simultaneous with the driving of one of bit lines $BLT_k$, $BLB_k$.

In response to word line $WL_j$ being driven active high at time $t_3$, pass transistors 35a, 35b (FIG. 4) are turned on, coupling storage nodes SNT, SNB to bit lines $BLT_k$, $BLB_k$, respectively. In response to the combination of word line $WL_j$ and column select line $CSL_k$ driven high, equalization transistors 36a, 36b, respectively, are turned on. With equalization transistors 36a, 36b both turned on, the voltages at storage nodes SNT, SNB rapidly equalize toward one another after time $t_3$, as shown in FIG. 6. Usually, the voltage at storage node SNB will continue to be rapidly pulled down by $BLB_k$, to below the voltage at storage node SNT. However, in some worst case conditions, the voltage at storage node SNB may tend to remain slightly above that at storage node SNT, as shown in FIG. 6. This behavior of the storage node voltages depend on the parasitic capacitances of transistors and conductors within cell $40_{jk}$, the relative drive capability of pass transistor 35b relative to that of load transistor 33b, and also the drive capabilities of equalization transistors 36a, 36b.

At time $t_4$, column select line $CSL_k$ is driven inactive low, turning off equalization transistor 36b. This isolates storage node SNT from storage node SNB. Meanwhile, in this example, word line $WL_j$ remains active high and pass transistors 35a, 35b continue to couple storage nodes SNT, SNB to bit lines $BLT_k$, $BLB_k$, respectively. After time $t_4$, therefore, equalization of storage nodes SNT, SNB ceases, and storage nodes SNT, SNB continue to charge and discharge, respectively, to the voltages at their respective bit lines $BLT_k$, $BLB_k$. Sense amplification of these voltages at storage nodes SNT, SNB, by inverters 31a, 31b also occurs following time $t_4$, once storage nodes SNT, SNB are isolated from one another. This causes storage nodes SNT, SNB to rapidly reach their written state, as shown in FIG. 6. At time $t_5$, word line $WL_j$ is de-asserted by row decoder 33, isolating the then-written state of cell $40_{jk}$ at storage nodes SNT, SNB from bit lines $BLT_k$, $BLB_k$. The write cycle is then complete, prior to time $t_6$ at which bit lines $BLT_k$, $BLB_k$ are precharged at the beginning of the next cycle.

The equalization of storage nodes SNT, SNB by equalization transistors 36a, 36b according to this embodiment of the invention, occurring between time $t_3$ and time $t_4$ in the example of FIG. 6, assists the successful completion of the intended write cycle. This "write assist" results because the equalization of these storage nodes SNT, SNB helps to overcome the tendency of inverters 31a, 31b to maintain the previously-stored state, even in those cells $40_{jk}$ in which device imbalance or other factors cause pass transistors 15a, 15b to have relatively weak drive as compared with load transistors 13 and driver transistors 14. Furthermore, even in those cells $40_{jk}$ that have good write margin, the operation of equalization transistors 36a, 36b speeds up the writing and latching of the new data state, enabling shorter write cycles and thus higher memory access performance. The write assist capability provided by this invention also widens the design window for cells $40_{jk}$, in that the design may be shifted to favor cell stability rather than write margin, because of the write assist effect provided by this embodiment of the invention.

Referring back to the portion of memory array 30 shown in FIG. 5, it is apparent that equalization transistors 36a, 36b do not affect the stability of "half-selected" cells $40_{jk}$. For example, if row "1" is selected (word line $WL_1$ driven high) and column "2" is selected (column select line $CSL_2$ driven high) in a given write cycle, only memory cell $40_{1,2}$ will have its storage nodes SNT, SNB equalized in that cycle. Equalization transistors 36b will remain off in half-selected cells $40_{1,0}$, $40_{1,1}$ in selected row "1", and equalization transistors 36a will remain on in half-selected cells $40_{0,2}$, $40_{2,2}$ in selected column "2". Data retention will therefore not be adversely affected in those half-selected cells 40, even though storage node equalization occurs in cell $40_{1,2}$.

Figure 7:
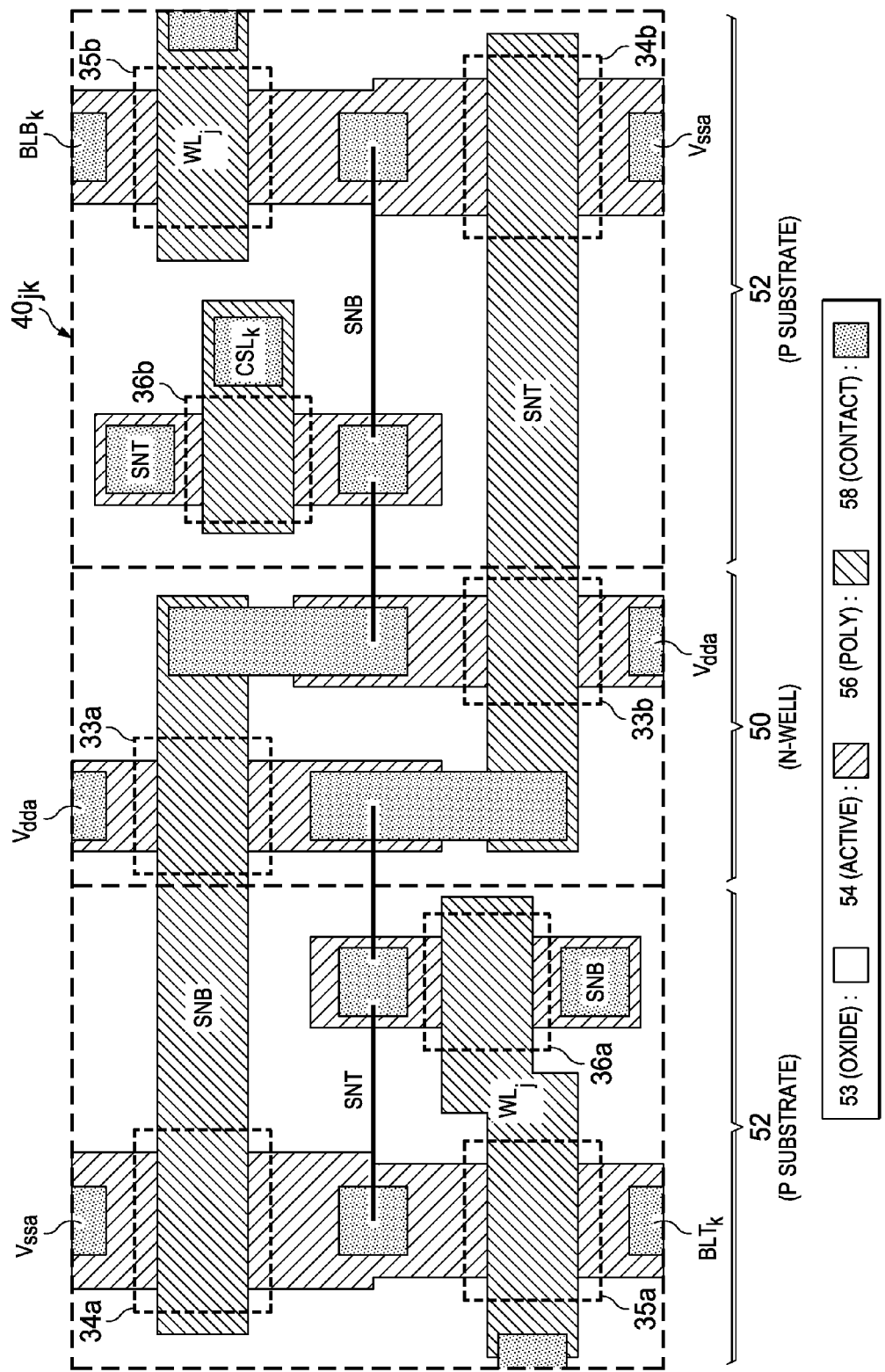
FIG. 7 is a plan view of the surface of an integrated circuit illustrating an example of the layout of the memory cell of FIG. 4 according to an embodiment of the invention.

Memory cell $40_{jk}$ constructed according to this embodiment of the invention can be realized efficiently from the standpoint of chip area, as will now be described in connection with FIG. 7. FIG. 7 illustrates, in plan view, an example of the layout of memory cell $40_{jk}$ at the surface of a silicon substrate, fabricated according to conventional CMOS technology. This plan view of FIG. 7 illustrates cell $40_{jk}$ prior to the formation of overlying metal layers, and as such illustrates diffused active regions, polysilicon gate elements, and contact openings (both metal-to-active contacts, and also metal-to-poly contacts).

As shown in FIG. 7, cell $40_{jk}$ is formed into a region of p-type substrate 52, at which n-well 50 has been formed by conventional methods. N-channel MOS transistors 34a, 35a, 36a are formed into one region of p-type substrate 52, and n-channel MOS transistors 34b, 35b, 36b are formed into another region of p-type substrate 52. P-channel MOS transistors 33a, 33b, are formed into n-well 50, which in this example lies between the two regions of p-type substrate 52 in cell $40_{jk}$; adjacent cells 40 can be formed on all four sides of cell $40_{jk}$, such that n-well 50 and regions of substrate 52 can be shared from cell to cell. In the conventional manner, active regions 54 are defined at the surface, between isolation oxide structures 53 formed as LOCOS field oxide or as shallow trench isolation (STI) structures, also in the conventional manner. Polysilicon elements 56 are patterned to extend above the surface, separated from the surface by gate oxide (not visible in this plan view) or by isolation oxide 53, as the case may be. Of course, active regions 54 within n-well 50 that are not underlying poly elements 56 will be p-type, and active regions 54 within regions of p-type substrate 52 that are not underlying poly elements 56 will be n-type. Contact openings 58 extend to active regions 54 or to poly elements 56, at the locations shown in FIG. 7 for this layout. Metal conductors (not shown in FIG. 7) will overly the structure, making contact via respective contact openings 58.

FIG. 7 illustrates the outline of the various transistors 33, 34, 35, 36 within cell $40_{jk}$, corresponding to the electrical schematic of FIG. 4. In this FIG. 7, as is fundamental in the art, MOS transistors are located at regions of the surface at which a gate element (i.e., poly element 56 in this example) overlies an instance of active region 54. FIG. 7 schematically illustrates internal metal connections between certain contact openings 58, for example indicating the extending of storage node SNT from active region 54 between transistors 34a, 35a to contact opening 58 at transistor 36a, and to poly element 56 serving as the gate of transistors 33b, 34b. Conversely, a metal connection will extend storage node SNB from active region 54 between transistors 34b, 35b to contact opening 58 at transistor 36b, and to poly element 56 serving as the gate of transistors 33a, 34a. Other metal connections (not shown) connect storage node SNT at its contact opening 58 to transistor 36b to another location of storage node SNT, and connect storage node SNB at its contact opening 58 to transistor 36a to another location of storage node SNB.

As evident from FIG. 7, equalization transistors 36a, 36b can be efficiently realized from the standpoint of chip area. In this simplified example, the additional chip area required for these devices amounts to additional width of p-type substrate 52, along the horizontal dimension in the orientation of FIG. 7. Of course, the layout of FIG. 7 is presented by way of example only, it being understood that the particular layout of cell $40_{jk}$ can vary widely from that shown, depending on the particular manufacturing technology and design rules applicable to each implementation, and on the layout optimization arrived at by those skilled in that art.

Figure 8A:
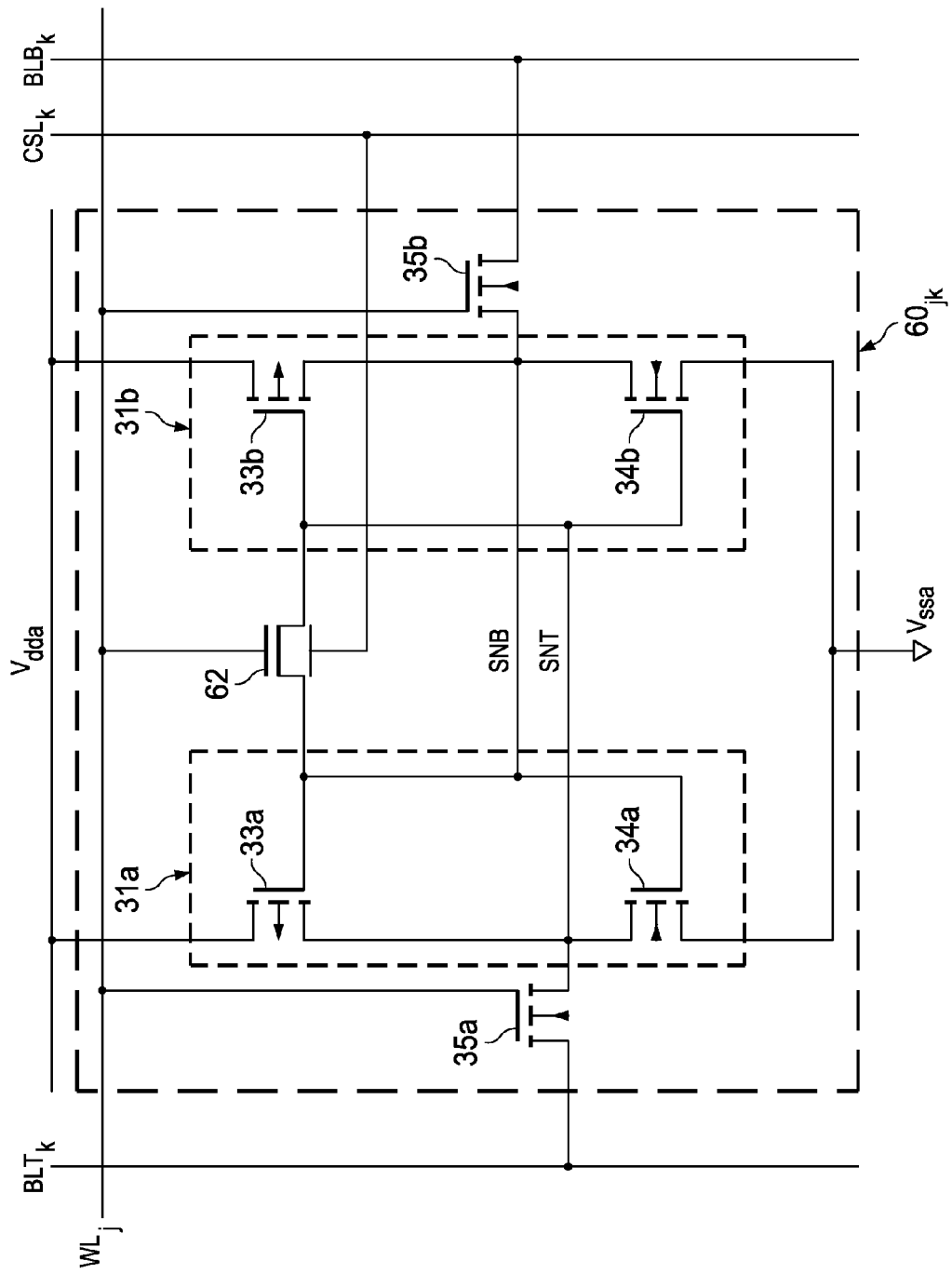
FIGS. 8a and 8b are electrical diagrams, in schematic form, of a memory cell in the memory of FIG. 3 according to alternative embodiments of the invention.

Numerous variations to the arrangement of cell $40_{jk}$, according to embodiments of this invention, will be apparent to those skilled in the art having reference to this specification. FIG. 8a illustrates cell $60_{jk}$ according to one such alternative embodiment of the invention; like elements in cell $60_{jk}$ with those in cell $40_{jk}$ of FIG. 4 are referred to by the same reference numerals. Cell $60_{jk}$ is constructed essentially identically with cell $40_{jk}$, relative to its storage element of inverters 31a, 31b and its pass transistors 35a, 35b, except that cell $60_{jk}$ includes an equalization gate consisting of a single double-gate transistor 62.

Double-gate transistor 62 in cell $60_{jk}$ of this embodiment of the invention is an n-channel transistor having two gate electrodes. The construction of double-gate transistor 62 requires the gate-to-source of both gate electrodes to exceed the threshold voltage for strong source/drain conduction. Double-gate transistor 62 can be constructed according to any of a number of conventional structures, depending on the available technology. For example, double-gate transistor 62 may be constructed in a silicon-on-insulator (SOI) technology in which the body node of the transistor is insulated from the underlying substrate by the buried insulator layer. In this construction, the transistor has both a polysilicon or other insulated gate at the surface, and also a separate "back-gate" contact to the body node. In the arrangement of FIG. 8a, word line $WL_j$ is connected to the "topside" gate and column select line $CSL_k$ is connected to the "back gate"; of course, the connection of word line $WL_j$ and column select line $CSL_k$ to the two gates may be reversed. Other double gate transistor construction useful as double-gate transistor 62 include devices referred to in the art as "FinFETs", as well as double-gate transistors with adjacent or overlapping gates (e.g., of double polysilicon construction).

Figure 8B:
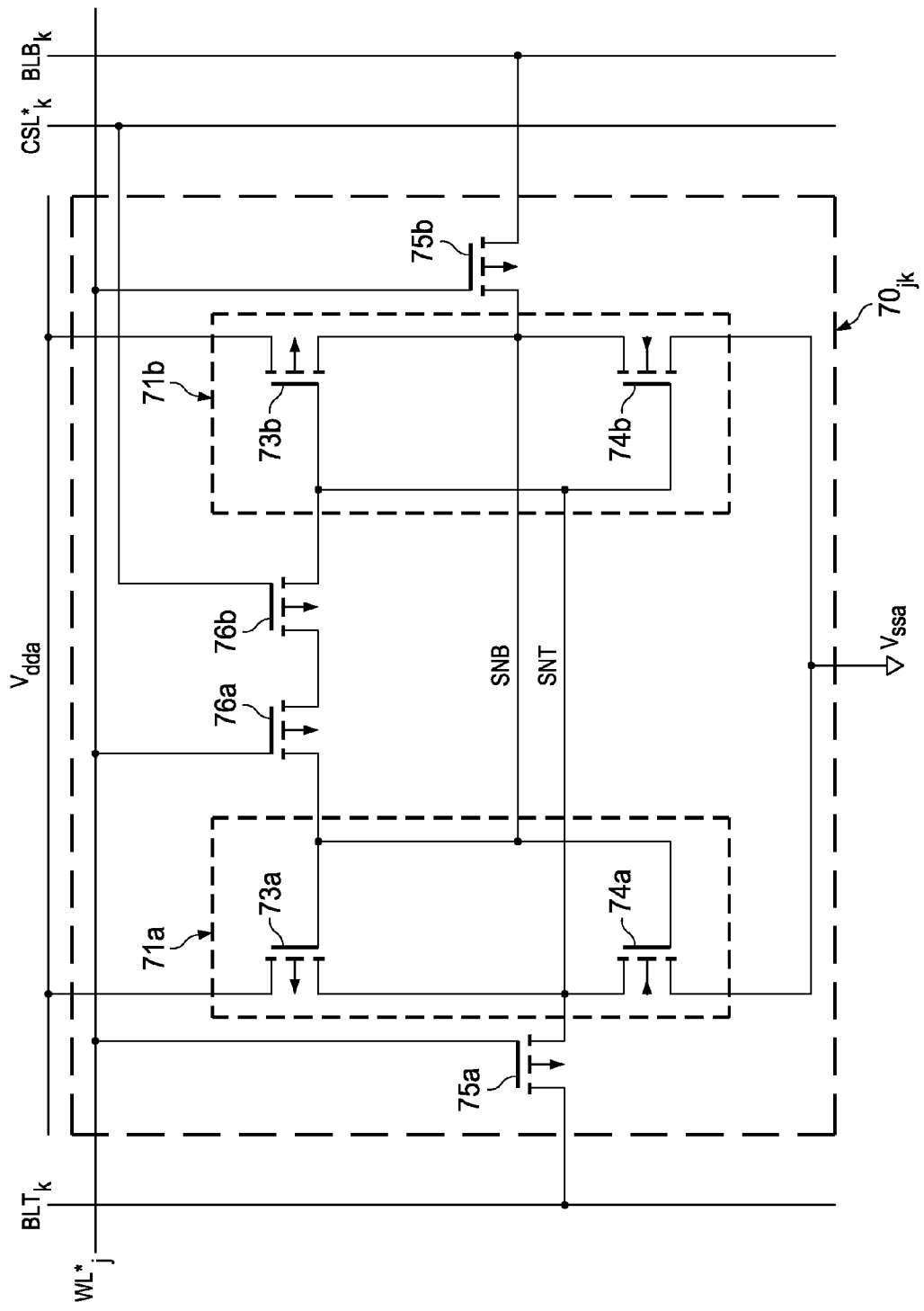

FIG. 8b illustrates memory cell $70_{jk}$ according to another alternative construction. Cell $70_{jk}$ according to this construction is largely complementary to that of SRAM cell $40_{jk}$ of FIG. 4, described above. As shown in FIG. 8b, the storage element of cell $70_{jk}$ is formed by a pair of cross-coupled CMOS inverters 71a, 71b. Inverter 71a is formed by p-channel MOS driver transistor 73a and n-channel MOS load transistor 74a, which have their drains connected together at storage node SNT and their gates connected together at storage node SNB. The source of load transistor 73a is connected to power supply node $V_{dda}$, and the source of driver transistor 74a is connected to ground, or reference, node $V_{ssa}$. Conversely, inverter 71b of SRAM cell $70_{jk}$ includes p-channel MOS driver transistor 73b and n-channel MOS load transistor 74b, which have their drains connected together at storage node SNB, and their gates connected together at storage node SNT. The source of transistor 73b is at power supply node $V_{dda}$ and the source of transistor 74b is at ground node $V_{ssa}$. According to this construction, p-channel MOS pass transistor 75a has its source/drain path connected between storage node SNT and bit line $BLT_k$ and p-channel MOS pass transistor 75b has its source/drain path connected between storage node SNB and bit line $BLB_k$. The gates of pass transistors 75a, 75b are connected to word line $WL^*_j$. Because pass transistors 75a, 75b are p-channel, row decoder 33 drives word line $WL^*_j$ to an active low level responsive to the received row address indicating selection of row j.

Cell $70_{jk}$ also includes, according to this embodiment of the invention, an equalization gate consisting of a pair of p-channel MOS equalization transistors 76a, 76b. The source/drain paths of equalization transistors 76a, 76b are connected in series with one another between storage node SNT and storage node SNB. Transistor 76a receives word line $WL^*_j$ at its gate, and transistor 76b receives column select line $CSL^*_k$ for column k at its gate. In this embodiment of the invention, because transistor 76b is a p-channel device, column select circuitry 32 drives column select line $CSL^*_k$ to an active low level upon selection of column k in a write cycle.

The operation of SRAM cell $70_{jk}$ of FIG. 8b according to this embodiment of the invention follows that described above in connection with cell $40_{jk}$ described above, except that the polarity of word line $WL^*_j$ and column select line $CSL^*_k$ is complementary from that shown in FIG. 6. More specifically, according to this embodiment of the invention shown in FIG. 8b, both of word line $WL^*_j$ and column select line $CSL^*_k$ will be driven to an active low level upon selection of cell $70_{jk}$ in a write cycle; in that event, equalization transistors 76a and 76b will both be turned on, shorting storage node SNT to storage node SNB. This equalization of storage nodes SNT, SNB in a write cycle to cell $70_{jk}$ assists the writing of an opposite data state from that previously stored by cell $70_{jk}$, as described above, improving the write margin and widening the design window.

As described above, the storage node equalization provided by each of the embodiments of the invention assists the successful completion of write cycles, by assisting the discharge of the previously-stored high level storage node. The extent to which the low level bit line in the selected column is required to counteract the previous state of the cell is greatly reduced, even in those cells in which the pass transistors are weak relative to the driver and load transistors. Faster write cycles result from embodiments of this invention, because of this cell-based write assist. As compared with conventional "by-column" write assist techniques, the data retention of half-selected cells is not adversely affected by embodiments of this invention, and precise control of the power supply voltages is also not required. This invention allows widening of the design window for static memories, by allowing the design to be shifted to favor cell stability rather than write margin. In addition, the cell devices required for implementation of embodiments of this invention can be efficiently realized in the cell layout.

While the present invention has been described according to its embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A solid-state memory cell, comprising:
   a storage element, for storing a data state represented at complementary first and second storage nodes;
   a first pass transistor having a conduction path connected between the first storage node and a first bit line, and having a control terminal for receiving a word line; and
   an equalization gate, having a conduction path connected between the first and second storage nodes, and having a first control terminal for receiving the word line, and a second control terminal for receiving a column select signal.

2. The solid-state memory cell of claim 1, further comprising:
   a second pass transistor having a conduction path connected between the second storage node and a second bit line, and having a control terminal for receiving the word line.

3. The solid-state memory cell of claim 1, wherein the first control terminal receives a row select signal.

4. The solid-state memory cell of claim 1, wherein the equalization gate comprises:
   a double-gate MOS transistor, having a first gate for receiving the word line, and a second gate for receiving the column select signal.

5. The solid-state memory cell of claim 1, wherein the equalization gate comprises:
   a first equalization transistor, having a conduction path, and having a control terminal for receiving the word line; and
   a second equalization transistor, having a conduction path connected in series with the conduction path of the first equalization transistor between the first and second storage nodes, and having a control terminal for receiving the column select signal.

6. The memory cell of claim 1, wherein the storage element comprises:
   a first inverter, having an input connected to the first storage node and an output connected to the second storage node; and
   a second inverter, having an input connected to the second storage node and an output connected to the first storage node.

7. The memory cell of claim 6, wherein the equalization gate comprises:
   a first equalization n-channel MOS transistor, having a conduction path, and having a control terminal for receiving the word line, wherein an active level on the word line corresponds to a row select signal; and
   a second equalization n-channel MOS transistor, having a conduction path connected in series with the conduction path of the first equalization transistor between the first and second storage nodes, and having a control terminal for receiving the column select signal.

8. The memory cell of claim 6, wherein the equalization gate comprises:
   a first equalization p-channel MOS transistor, having a conduction path, and having a control terminal for receiving the word line, wherein an active level on the word line corresponds to a row select signal; and
   a second equalization p-channel MOS transistor, having a conduction path connected in series with the conduction path of the first equalization transistor between the first and second storage nodes, and having a control terminal for receiving the column select signal.

9. A method of writing a data state for storage in a solid-state memory, the memory comprising a plurality of memory cells arranged in rows and columns, each row of memory cells associated with a word line, each column of memory cells associated with first and second bit lines, each memory cell storing a data state represented at complementary first and second storage nodes, the method comprising:
   receiving a memory address including a row portion and a column portion;
   for one or more columns of memory cells selected according to the column portion of the memory address, driving differential levels onto the first and second bit lines according to the data state to be written;
   energizing a word line for a row selected according to the row portion of the memory address;
   responsive to the energizing the word line, coupling the first and second storage nodes of memory cells in the selected row to corresponding first and second bit lines, respectively;
   energizing a column select line associated with each of the selected one or more columns of memory cells;
   during the coupling step and responsive to the energizing the word line and the column select line, connecting the first and second storage nodes together in a memory cell in the selected row and the selected one or more columns;
   then disconnecting the first and second storage nodes from one another in the memory cell in the selected row and the selected one or more columns; and
   then de-coupling the first and second storage nodes from the first and second bit lines.

10. The method of claim 9, further comprising:
    before the driving step, precharging the first and second bit lines to a precharge voltage; and wherein the driving step comprises driving one of the first and second bit lines of the selected columns to a voltage different from the precharge voltage, and corresponding to a data state to be written.

11. The method of claim 9, wherein the word line is coupled to the gate of a first pass transistor having a conduction path between the first storage node and the first bit line, and coupled to the gate of a second pass transistor having a conduction path connected between the second storage node and the second bit line; and wherein the de-coupling step comprises de-energizing the word line.

12. The method of claim 11, wherein the connecting step comprises:
responsive to the steps of energizing the word line and the column select line, turning on an equalization gate having a conduction path connected between the first and second storage nodes.

13. The method of claim 12, wherein the equalization gate has a first gate coupled to the column select line, a second gate coupled to the word line, and a conduction path connected between the first and second storage nodes.

14. The method of claim 13, wherein the disconnecting step comprises:
de-energizing the column select line.

15. The method of claim 14, wherein the step of de-energizing the word line is performed after the step of de-energizing the column select line.

16. The method of claim 9, wherein the connecting step comprises:
responsive to the coupling step, turning on an equalization gate having a conduction path connected between the first and second storage nodes;
and further comprising:
then reading the written data state, by:
receiving a memory address including a row portion and a column portion;
coupling the first and second storage nodes of memory cells in the selected row to corresponding first and second bit lines, respectively; and
sensing a differential signal at the first and second bit lines of the selected one or more columns.

17. An integrated circuit, comprising a solid state memory, the memory comprising:
an array of solid-state memory cells arranged in rows and columns, each memory cell comprising:
a storage element, for storing a data state represented at complementary first and second storage nodes;
a first pass transistor having a conduction path connected between the first storage node and a first bit line, and having a control terminal for receiving a word line; and
an equalization gate, having a conduction path connected between the first and second storage nodes, and having a first control terminal connected to the word line, and a second control terminal connected to a column select line; and
address select circuitry, for receiving an address value having a row portion and a column portion, for energizing a word line associated with a row of memory cells corresponding to the row portion of the address value, and for energizing one or more column select lines associated with one or more columns of memory cells corresponding to the column portion of the address value; and
read/write circuitry coupled to the first and second bit lines of the columns of memory cells.

18. The integrated circuit of claim 17, wherein each of the memory cells further comprises:
a second pass transistor having a conduction path connected between the second storage node and a second bit line, and having a control terminal for receiving the word line.

19. The integrated circuit of claim 17, wherein, for each of the memory cells, the first control terminal is connected to the word line for its row, such that the word line corresponds to a row select line;
and wherein the address select circuitry energizes one or more column select lines associated with one or more columns of memory cells corresponding to the column portion of the address value responsive to a write enable signal indicating a write cycle.

20. The integrated circuit of claim 17, wherein the equalization gate of each of the memory cells comprises:
a double-gate MOS transistor, having a first gate connected to the word line, and a second gate connected to the column select line.

21. The integrated circuit of claim 17, wherein the equalization gate of each of the memory cells comprises:
a first equalization transistor, having a conduction path, and having a control terminal connected to the word line; and
a second equalization transistor, having a conduction path connected in series with the conduction path of the first equalization transistor between the first and second storage nodes, and having a control terminal connected to the column select line.

22. The integrated circuit of claim 17, wherein the storage element comprises:
a first inverter, having an input connected to the first storage node and an output connected to the second storage node; and
a second inverter, having an input connected to the second storage node and an output connected to the first storage node;
wherein the equalization gate comprises:
a first equalization n-channel MOS transistor, having a conduction path, and having a control terminal connected to the word line, wherein the word line corresponds to a row select signal; and
a second equalization n-channel MOS transistor, having a conduction path connected in series with the conduction path of the first equalization transistor between the first and second storage nodes, and having a control terminal for receiving the column select line;
and wherein the address select circuitry energizes one or more column select lines associated with one or more columns of memory cells corresponding to the column portion of the address value responsive to a write enable signal indicating a write cycle.

23. The integrated circuit of claim 17, wherein the storage element comprises:
a first inverter, having an input connected to the first storage node and an output connected to the second storage node; and
a second inverter, having an input connected to the second storage node and an output connected to the first storage node;
and wherein the equalization gate comprises:
a first equalization p-channel MOS transistor, having a conduction path, and having a control terminal for receiving the word line, wherein the word line corresponds to a row select signal; and a second equalization p-channel MOS transistor, having a conduction path connected in series with the conduction path of the first equalization transistor between the first and second storage nodes, and having a control terminal for receiving the column select line;

and wherein the address select circuitry energizes one or more column select lines associated with one or more columns of memory cells corresponding to the column portion of the address value responsive to a write enable signal indicating a write cycle.

24. The integrated circuit of claim 17, wherein the address select circuitry comprises:
 a row decoder for decoding a row portion of the address value, and for driving one of a plurality of word lines responsive to the value of the row portion of the address signal;
 a column decoder for decoding a column portion of the address value, and for driving one of a plurality of column select lines during a write operation, responsive to the value of the column portion of the address signal.

25. The integrated circuit of claim 24, wherein, for each of the memory cells, the first control terminal is connected to the word line for its row, such that the word line corresponds to a row select line.

26. The integrated circuit of claim 17, further comprising:
 a logic circuit coupled to the read/write circuitry and the address select circuitry.

* * * * *